United States Patent
Park et al.

(10) Patent No.: US 6,989,571 B2
(45) Date of Patent: Jan. 24, 2006

(54) ACTIVE MATRIX ORGANIC ELECTRO LUMINESCENCE DEVICE PANEL

(75) Inventors: Jae Yong Park, Anyang-si (KR); Joon Kyu Park, Anyang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 2 days.

(21) Appl. No.: 10/876,720

(22) Filed: Jun. 28, 2004

(65) Prior Publication Data

US 2004/0262605 A1   Dec. 30, 2004

(30) Foreign Application Priority Data

Jun. 27, 2003   (KR) .................... 10-2003-0042407

(51) Int. Cl.
*H01L 31/0392* (2006.01)
*H01L 29/04* (2006.01)
*H01L 31/036* (2006.01)
*H01L 31/0376* (2006.01)
*H01L 31/20* (2006.01)

(52) U.S. Cl. ........................... 257/350; 257/59; 257/72

(58) Field of Classification Search ................ 257/59, 257/72, 350

See application file for complete search history.

(56) References Cited

U.S. PATENT DOCUMENTS

2003/0016459 A1 * 1/2003 Takizawa et al. ........... 359/885
2004/0046184 A1 * 3/2004 Yanagawa et al. .......... 257/200

* cited by examiner

*Primary Examiner*—Ngân V. Ngô

(74) *Attorney, Agent, or Firm*—Morgan Lewis & Bockius LLP (57) ABSTRACT

An active matrix organic electro luminescence device panel includes: a first substrate having a plurality of thin film transistors and a plurality of first electrodes that define regions arrayed in matrix that each contain a pixel, wherein each pixel has an organic electro luminescence layer and a second electrode, which are sequentially formed on one of the first electrodes; a second substrate being positioned over the second electrode to prevent the organic electro luminescence layer from being degraded due to oxygen and moisture; and a sealant that adheres the first and second substrates to each other, wherein a plurality of wires and a driver are formed on the second substrate to provide a signal for driving the first electrodes.

20 Claims, 7 Drawing Sheets

ACTIVE MATRIX ORGANIC ELECTRO LUMINESCENCE DEVICE PANEL

This application claims the benefit of Korean Patent Application No. 42407/2003 filed in Korea on Jun. 27, 2003, which is hereby incorporated by reference.

BACKGROUND OF THE INVENTION

1. Field of the Invention

The present invention relates to an organic electro luminescence device, and more particularly, to an active matrix organic electro luminescence device panel in which a peripheral circuit is integrated and mounted on a second substrate not having a pixel.

2. Description of the Related Art

Cathode Ray Tube (CRT) display devices and liquid crystal display (LCD) devices are the most commonly used display devices. However, as a flat panel display devices are increasingly required to occupy smaller spaces, be lighter in weight and/or have a larger display size, an organic electro luminescence device (hereinafter, referred to as "organic EL device") is being rapidly developed as a viable flat panel display device. Several products have been delivered to a market using organic EL technology. Further, in recently developed organic EL devices, an active matrix organic light emitting diode (AMOLED) has been used to enable individual control a pixel, which defines the elementary unit forming a picture.

Each AMOLED includes a thin film transistor and an ITO electrode (anode) as a pixel electrode, which are arrayed in matrix on a transparent substrate. An organic emission layer, which emits light of a predetermined wavelength, and an upper electrode (cathode) are formed on the pixel electrode. The structure of the AMOLED is encapsulated by a metal to prevent degradation of the organic emission layer due to oxygen and moisture.

More particularly, the AMOLED includes an organic electro luminescence layer formed between the anode and the cathode. The anode is a transparent electrode of a material such as ITO, and the cathode uses a metal (Ca, Li, Al:Li, Mg:Ag and the like) with a low work function. If a forward voltage is applied between the anode and the cathode, holes and electrons are injected into the anode and the cathode. The injected holes and electrons are combined to form excitons. The excitons are radiatively recombined causing an electro emission phenomenon.

The organic electro luminescence layer can be formed of a single material, but is generally formed of several organic materials to have a multi-layer structure. That is, because the holes and the electrons can be effectively transmitted to the organic emission layer (EML) in the organic material due to the large mobility difference between holes and electrons when the hole transport layer (HTL) and the electron transport layer (ETL) are used. The densities of the holes and the electrons are balanced in the organic emission layer, thereby enhancing emission efficiency. Further, according to the particular application, a hole injection layer (HIL), such as a conductive polymer, is additionally inserted on the anode and the HTL to lower an energy barrier against hole injection. Furthermore, a buffer layer (EIL), such as LiF, is added with a small thickness of about 5–10Å between the cathode and the ETL to lower an energy barrier against electron injection, thereby enhancing the emission efficiency and lowering a driving voltage. Additionally, the organic material used for the organic emission layer inserted between the both electrodes has an advantage in that a composition route is simple to facilitate various types of material composition and enable color tuning.

Figure 1:
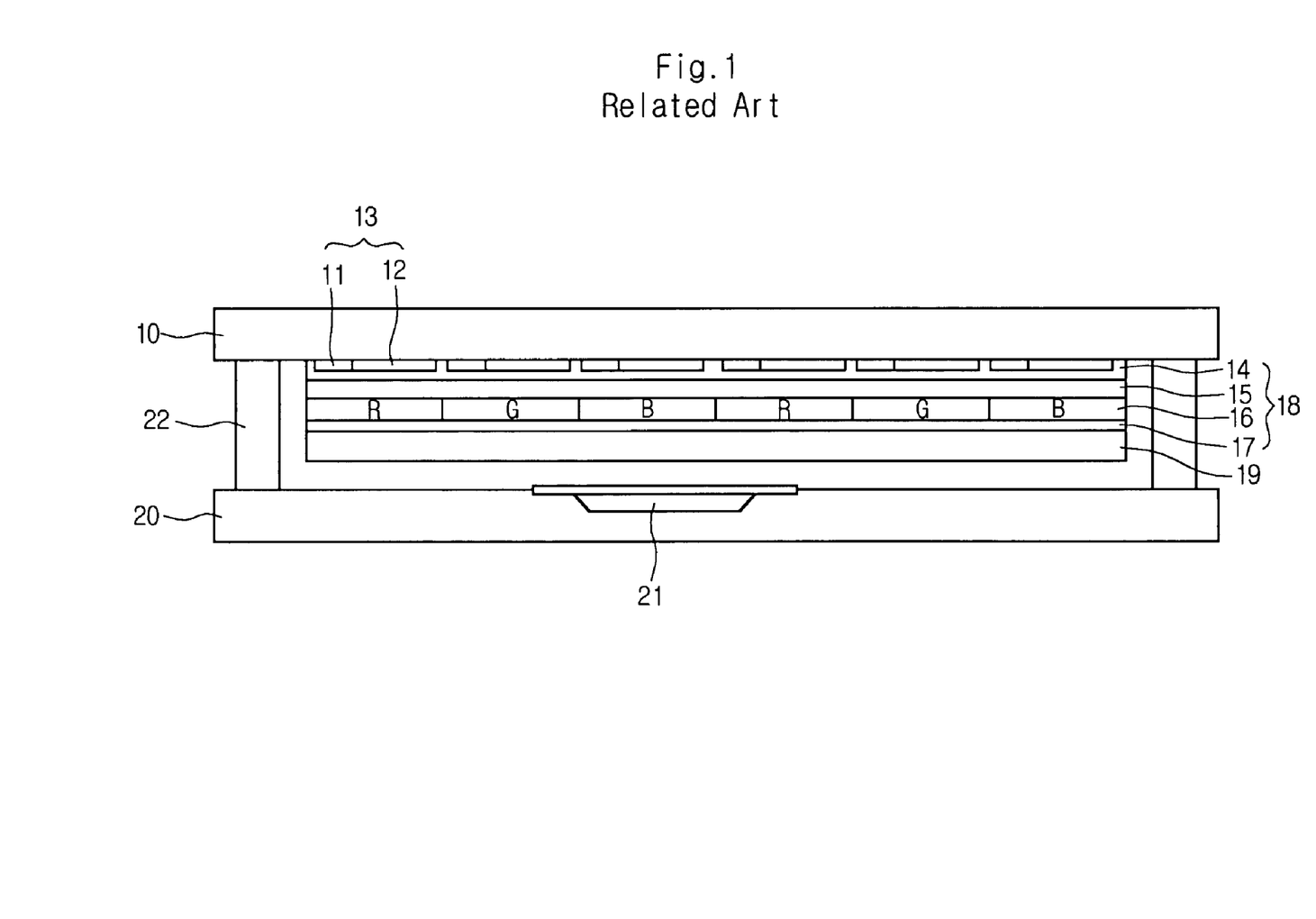
FIG. 1 is a sectional view illustrating a related-art AMOLED panel.

FIG. 1 is a sectional view illustrating a related-art AMOLED panel.

Referring to FIG. 1, the AMOLED panel includes a plurality of pixels 13, which is arrayed in matrix on a first substrate 10. Each of the pixels 13 includes a thin film transistor 11 and an Indium Tin Oxide (ITO) as a pixel electrode 12. The pixel 13 is formed at a region, which is defined between a plurality of gate lines (not shown) and a plurality of data lines (not shown). An organic electro luminescence layer 18 and a cathode 19 are sequentially formed on the pixel electrode 12. As described above, the organic electro luminescence layer 18 includes a hole injection layer (HIL) 14, a hole transporting layer (HTL) 15, an organic emission layer 16 of red, green, blue, and an electron injection layer (EIL) 17. Further, a desiccant 21 is adhered on an inner surface of the second substrate 20 within a space defined by the second substrate 20 to prevent the emission characteristics of the organic emission layer 16 of the organic electro luminescence layer 18 from being degraded and to prevent the cathode 19 from being lifted-off. The desiccant 21 functions to eliminate moisture. Here, the second substrate 20 functions to encapsulate the organic EL structure, and is sealed with the first substrate 10 by a sealant 22.

Figure 2:
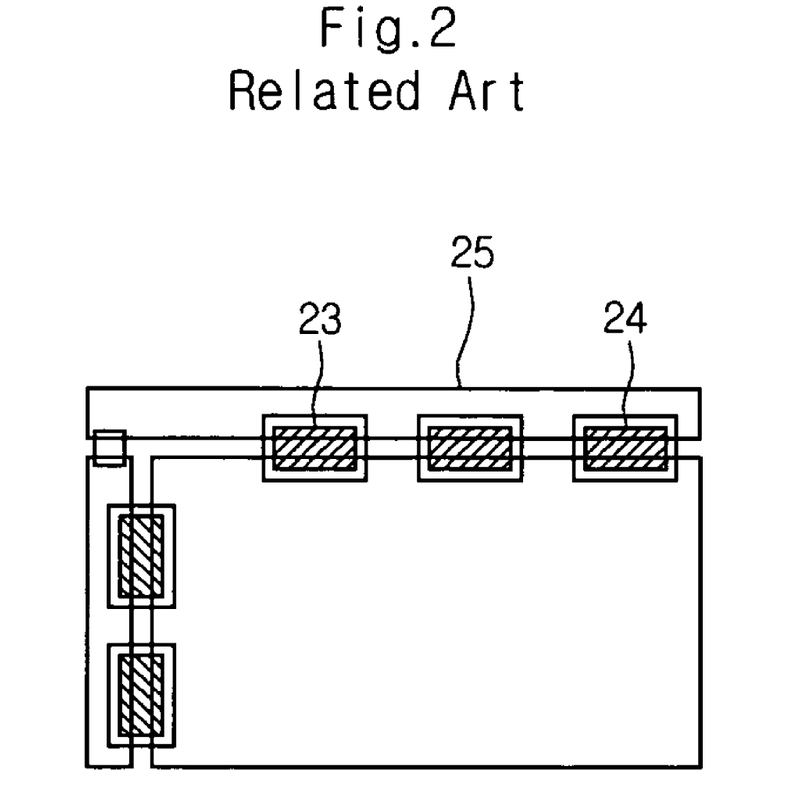
FIG. 2 is a schematic plan view illustrating a related-art AMOLED panel.

The AMOLED panel includes drivers and the like for applying a predetermined signals to the gate lines and the data lines. A structure of the related-art AMOLED panel having drivers and the like mounted thereon will be described with reference to FIG. 2. FIG. 2 is a schematic plan view illustrating a related-art AMOLED panel.

Referring to FIGS. 1 and 2, in the related-art AMOLED panel, a tape carrier package (TCP) 24 with the driver 23 is attached to one side or both sides of the first substrate 10. At this time, the TCP 24 is concurrently attached to the AMOLED panel and a printed circuit board (PCB) substrate 25 having a timing controller and the like to transmit a gate signal and a data signal from the PCB substrate 25 to the AMOLED panel.

In the above-constructed related-art AMOLED panel, the first substrate 10 includes a TCP pad forming part to which the TCP is attached, and a wire part for connecting between a TCP pad and a pixel array part, thereby causing a complicated structure at an edge region of the first substrate, whereas the second substrate 20 simply functions only to attach the desiccant 21 and provide a sealed space. Accordingly, the related-art AMOLED panel structure has a disadvantage in that the peripheral circuit of the panel is entirely mounted on the PCB. As a result, a wire structure of the first substrate is also complicated, thereby limiting the overall compactness of the panel.

SUMMARY OF THE INVENTION

Accordingly, the present invention is directed to an active matrix organic electro luminescence device panel that substantially obviates one or more problems due to limitations and disadvantages of the related art.

An object of the present invention is to provide an active matrix organic electro luminescence device panel which increases circuit integration and provides a compact AMOLED panel.

Additional features and advantages of the invention will be set forth in the description which follows, and in part will be apparent from the description, or may be learned from practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described herein, an active matrix organic electro luminescence device panel comprises a first substrate having a plurality of thin film transistors and a plurality of first electrodes that define regions arrayed in matrix that each contain a pixel, wherein each pixel has an organic electro luminescence layer and a second electrode, which are sequentially formed on one of the first electrodes; a second substrate being positioned over the second electrode to prevent the organic electro luminescence layer from being degraded due to oxygen and moisture; and a sealant that adheres the first and second substrates to each other, wherein a plurality of wires and a driver are formed on the second substrate to provide a signal for driving the first electrodes.

In another aspect, an active matrix organic electro luminescence device panel comprises a first substrate having a plurality of thin film transistors and a plurality of first electrodes, which are respectively within pixels arrayed in matrix, wherein each pixels has an organic electro luminescence layer and a second electrode sequentially formed on one of the first electrodes; a second substrate positioned over the second electrode to prevent the organic electro luminescence layer from being degraded due to oxygen and moisture; and a sealant that adheres the first substrate to the second substrate, wherein a plurality of wires and a driver are formed on the second substrate to provide a signal for driving the first electrodes, and a timing controller and a memory are formed on the second substrate to input predetermined data to the driving circuit.

In another aspect, an active matrix organic electro luminescence device panel comprises a first substrate having a plurality of thin film transistors and a plurality of first electrodes, which are respectively within pixels arrayed in matrix, wherein each pixels has an organic electro luminescence layer and a second electrode sequentially formed on one of the first electrodes; a second substrate being positioned over the second electrode to prevent the organic electro luminescence layer from being degraded due to oxygen and moisture; a sealant that adheres the first and second substrates to each other; and a connection portion that electrically connects the first and second substrates with each other, wherein the signal of a driver or a power source for driving the organic electro luminescence layer is transmitted to the first substrate through the connection portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 3:
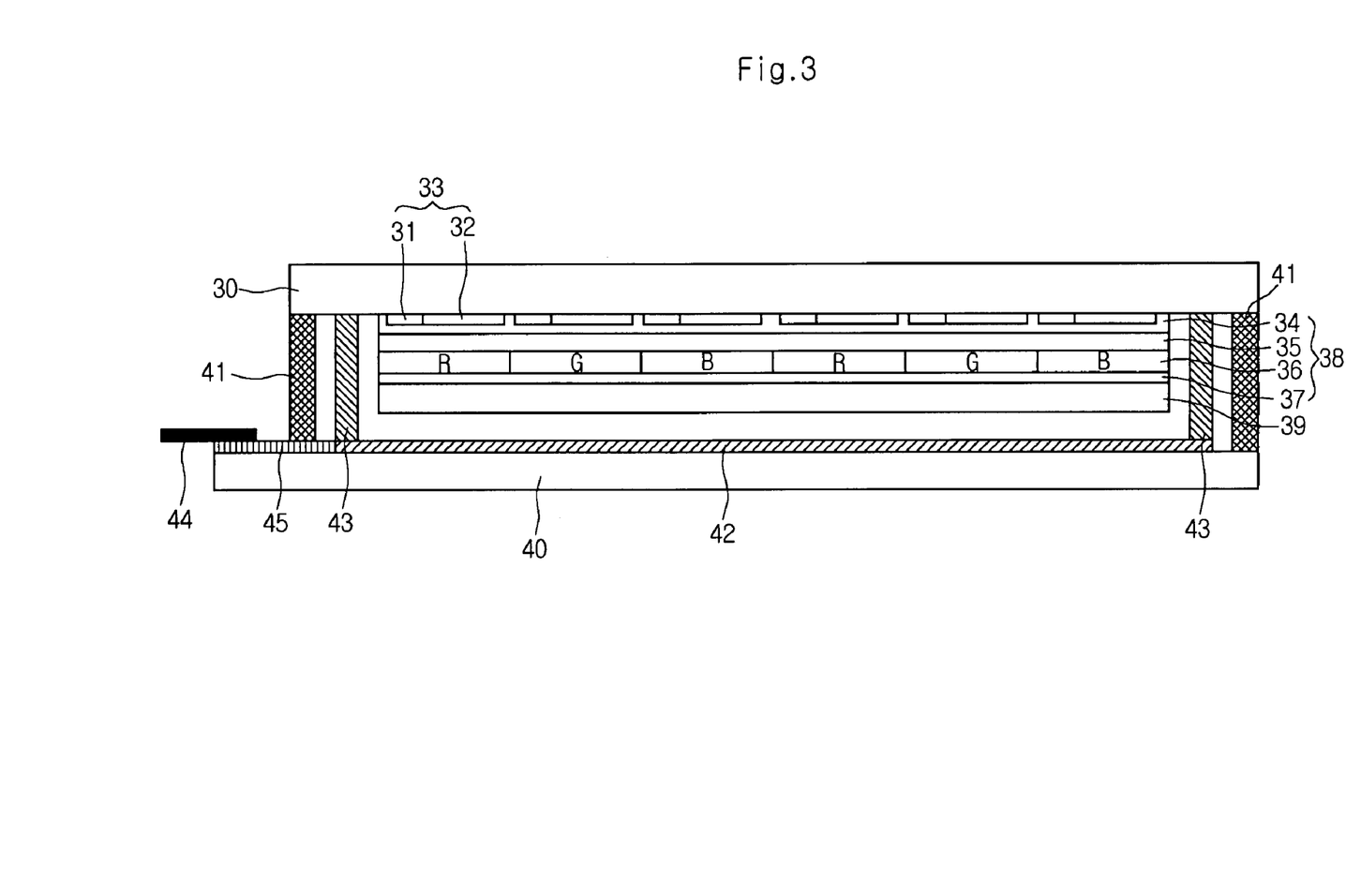
FIG. 3 is a sectional view illustrating an exemplary AMOLED panel configuration according to the present invention.

FIG. 3 is a sectional view illustrating an AMOLED panel according to the present invention. Referring to FIG. 3, the AMOLED panel includes a plurality of thin film transistors 31 and a plurality of first electrodes (pixel electrodes) 32, which are respectively in pixels 33 arrayed in matrix. Here, the pixels 33 are respectively formed in regions, which are defined between a plurality of gate lines (not shown) and a plurality of data lines (not shown). Further, an organic electro luminescence layer 38 and a second electrode (cathode) 39 are sequentially formed on the pixel electrodes 32.

More particularly, the organic electro luminescence layer 38 includes a hole injection layer (HIL) 34, a hole transporting layer (HTL) 35, an organic emission layer 36 of red, green, blue, and an electron injection layer (EIL) 37. The pixel electrode 32 is formed of a transparent electrode, such as ITO (Indium Tin Oxide), to function as an anode. The anode 39 is formed of a metal with a low work function, such as Ca, Li, Al:Li, Mg:Ag and the like.

The second substrate 40 is formed over the cathode 39 to prevent emission characteristics of the organic emission layer 36 of the organic electro luminescence layer 38 from being degraded due to oxygen and moisture. The second substrate 40 functions to encapsulate the structure. The second substrate 40 and the first substrate 30 are seal together by a sealant 41.

The AMOLED panel also includes a plurality of wires, drivers and the like for applying a signal to the gate line and/or the data line to drive the pixel electrode 32. A peripheral circuit 42, such as a driver, is also provided on the second substrate 40. Depending on the application requirements, a timing controller and a memory can also be mounted on the second substrate 40.

The second substrate 40 and the first substrate 30 can electrically connected by a connection part 43. The connection part 43 functions to transmit the signal of the peripheral circuit 42 such as the driver or a power source for driving the organic emission layer 36, to the first substrate 30. Here, the power from the power source is transmitted to the first substrate 30 through the plurality of wires 42, which is formed on the second substrate 40.

A flexible printed circuit (FPC) 44 and a connection pad 45 are provided at one side of the second substrate 40. The connection pad 45 is disposed between the second substrate 40 and the FPC 44. Through the FPC 44 and the connection pad 45, the AMOLED panel is electrically connected with an external system (not shown) which provides the AMOLED panel with the power source, an external image signal, and the like.

Figure 4:
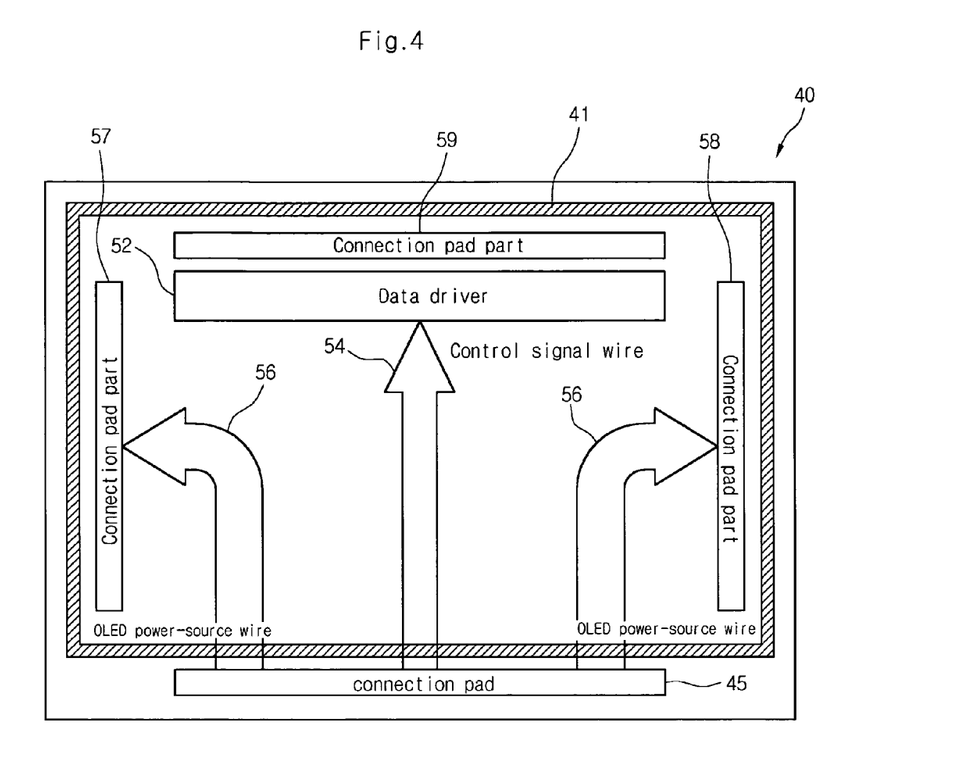
FIG. 4 is a plan view illustrating a second substrate of an exemplary AMOLED panel according to an embodiment of the present invention.
Figure 5:
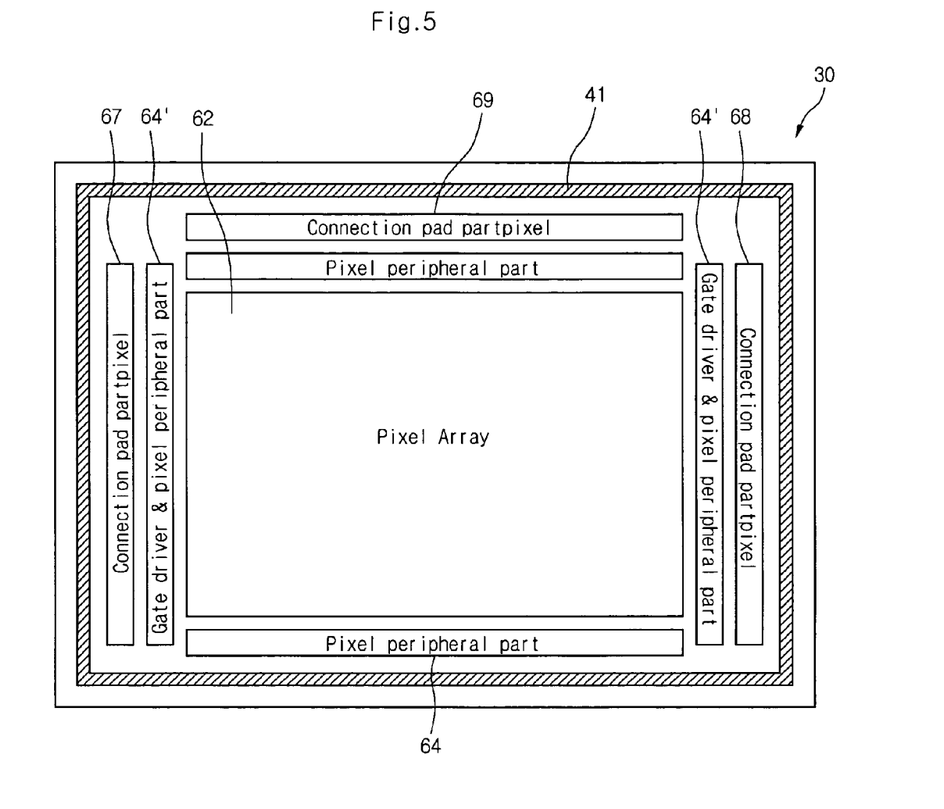
FIG. 5 is a plan view illustrating a first substrate of an exemplary AMOLED panel according to an embodiment of the present invention.

FIG. 4 is a plan view illustrating the second substrate of the AMOLED panel according to a first embodiment of the present invention, and FIG. 5 is a plan view illustrating the first substrate of the AMOLED panel according to the first embodiment of the present invention. FIGS. 4 and 5 illustrate a symmetric structure of the first and second substrates. When the first and second substrates are combined, the combination corresponds to a structure of the AMOLED panel according to the first embodiment of the present invention.

Referring to FIGS. 3 and 4, a data driver 52 is provided in the second substrate 40. The power source and a data driver control-signal are applied through a FPC connection pad 45 of the second substrate 40. The power source is supplied to the organic electro luminescence layer 38 from the external system (OLED power source). For this, an OLED power-source wire 56 and a data driver control-signal wire 54 are provided in the second substrate 40.

The control-signal wire 54 is connected to the data driver 52 to transmit the control-signal to the data driver 52. The OLED power source wire 56 is connected to connection pad portions 57 and 58 among the connection pad portions 57, 58 and 59 to transmit the power source to the connection portions 43. The connection pad portion 57 and 58 are disposed at both sides of the second substrate 40. The connection portion 43 electrically connects the second substrate 40 with the first substrate 30.

Referring to FIGS. 3 and 5, the first substrate 30 includes a pixel array 62 having the plurality of thin film transistors and the plurality of pixel electrodes, which respectively form the pixels 33 and are arrayed in matrix; pixel peripheral portions 64 and 64', which has electrostatic prevention circuits encompassing the pixel array 62 and the like; and a plurality of connection pad portions 67, 68 and 69 connected to the connection part 43, which is electrically connected with the second substrate 40 to receive the OLED power source and the data driving signal from the second substrate 40. Here, the connection pad portions 67, 68 and 69 on the first substrate 30 are symmetrically connected with the connection pad portions 57, 58 and 59 on the second substrate 40, respectively.

The first substrate 30 and the second substrate 40 are adhered to each other by the sealant 41. However, in the first embodiment shown in FIGS. 4 and 5, a gate driver is provided together with the pixel peripheral part 64' on the first substrate 30. That is, because when poly-silicon is used to form the thin film transistors on the first substrate 30, the gate driver and pixel peripheral part 64' can be mounted with a width of about 1 mm to 2 mm on the first substrate 30, and accordingly, it is not particularly required to mount the gate driver on the second substrate 40. In contrast, the data driver 52 is mounted on the second substrate 40 because it has a width of about 4 mm to 5 mm and needs more wires than the gate driver.

Figure 6:
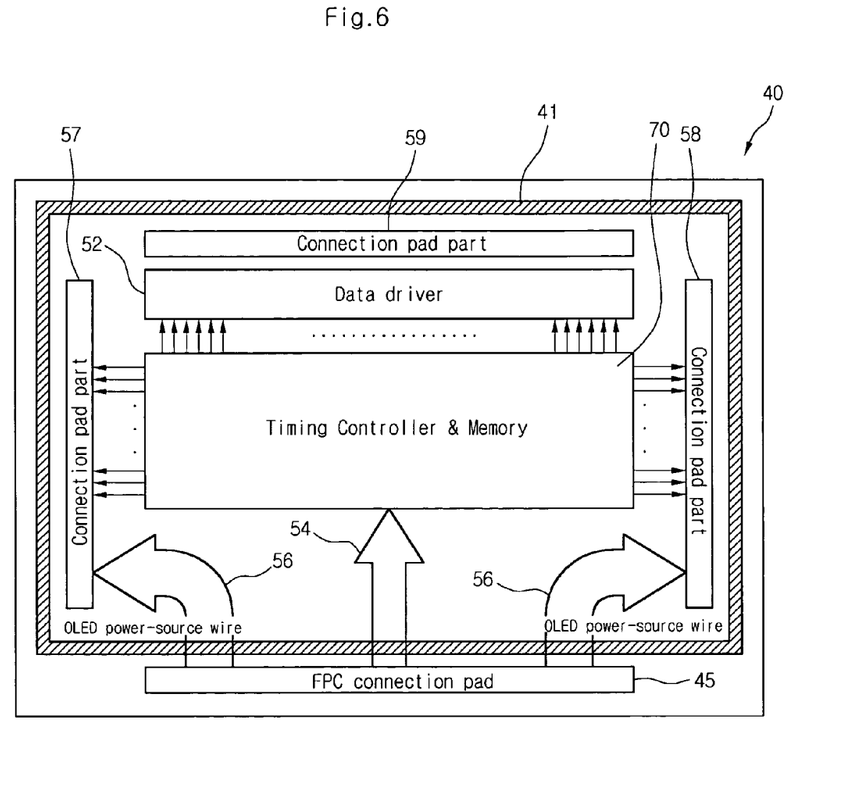
FIG. 6 is a plan view illustrating a second substrate of an AMOLED panel according to a second embodiment of the present invention.
Figure 7:
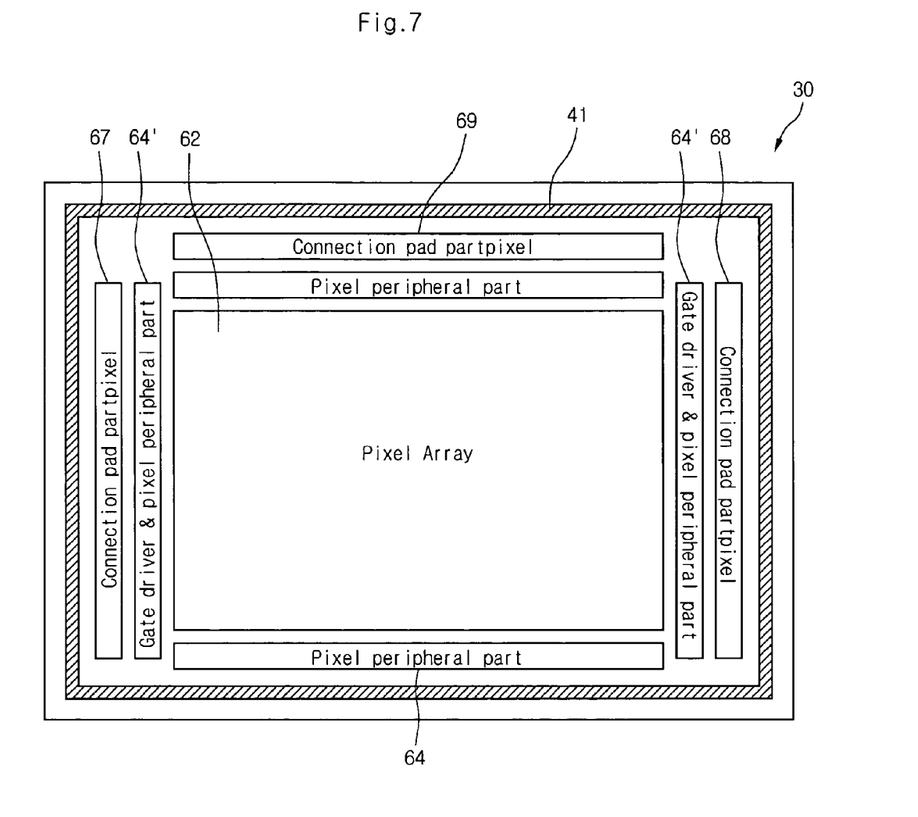
FIG. 7 is a plan view illustrating a first substrate of an AMOLED panel according to the second embodiment of the present invention.

FIG. 6 is a plan view illustrating a second substrate of an AMOLED panel according to a second embodiment of the present invention, and FIG. 7 is a plan view illustrating a first substrate of an AMOLED panel according to the second embodiment of the present invention. FIGS. 6 and 7 illustrate a symmetric structure of the first and second substrates. When the first and second substrates are combined, the combination corresponds to a structure of the AMOLED panel according to the second embodiment of the present invention. Since they are similar in some respects to the first and second substrates shown in FIGS. 4 and 5, the same reference numbers will be used to refer to similar portions, and the description for the similar portions and operations will be omitted.

The second embodiment shown in FIGS. 6 and 7 has a timing controller and a memory 70 that are additionally mounted on the second substrate 40. The timing controller inputs predetermined data to the data driver 52 and the gate driver while the memory stores specific data. The thin film transistors are poly-silicon thin film transistors formed through a poly process on the first substrate 30 and the second substrate 40. As a result, more complicated circuits and wirings are formed on the second substrate 40 as compared with the first embodiment of FIGS. 4 and 5. As a result, circuit integration can be increased, thereby providing a more compact AMOLED panel. That is, a light-weight and slim structure can be achieved as compared with the related-art AMOLED panel.

As described above, in accordance with the active matrix organic electro luminescence device panel of the present invention, the peripheral circuit for the panel can be integrated and mounted on the second substrate, thereby providing a narrow bezel panel.

It will be apparent to those skilled in the art that various modifications and variations can be made in the active matrix organic electro luminescence device panel of the present invention. Thus, it is intended that the present invention cover the modifications and variations of this invention provided they come within the scope of the appended claims and their equivalents.

What is claimed is:

1. An active matrix organic electro luminescence device panel, comprising:
   a first substrate having a plurality of thin film transistors and a plurality of first electrodes that define regions arrayed in matrix that each contain a pixel, wherein each pixel has an organic electro luminescence layer and a second electrode, which are sequentially formed on one of the first electrodes;
   a second substrate being positioned over the second electrode to prevent the organic electro luminescence layer from being degraded due to oxygen and moisture; and
   a sealant that adheres the first and second substrates to each other,
   wherein a plurality of wires and a driver are formed on the second substrate to provide a signal for driving the first electrodes.

2. The panel according to claim 1, wherein the first electrode uses a transparent electrode, such as an ITO (Indium Tin Oxide), as an anode and the second electrode uses a metal with a low work function as a cathode.

3. The panel according to claim 1, wherein the driver applies a predetermined signal to at least one of the gate lines and the data lines.

4. The panel according to claim 1, further comprising a connection portion that electrically connects the first and second substrates with each other, wherein the signal of the driver or a power source for driving the organic electro luminescence layer is transmitted to the first substrate through the connection portion.

5. The panel according to claim 1, wherein the driver is a data driver.

6. The panel according to claim 1, wherein the plurality of wires includes a driver control-signal wire to provide the driver with a control signal, and an OLED (organic light emitting diode) power-source wire to supply the power source to the organic electro luminescence layer.

7. The panel according to claim 1, wherein a FPC (flexible printed circuit) and a FPC connection pad are provided at one side of the second substrate, the connection pad being disposed between the second substrate and the FPC, and wherein the FPC and the connection pad electrically connect the panel with an external system.

8. An active matrix organic electro luminescence device panel, comprising:
   a first substrate having a plurality of thin film transistors and a plurality of first electrodes, which are respectively within pixels arrayed in matrix, wherein each pixels has an organic electro luminescence layer and a second electrode sequentially formed on one of the first electrodes;
   a second substrate positioned over the second electrode to prevent the organic electro luminescence layer from being degraded due to oxygen and moisture; and
   a sealant that adheres the first substrate to the second substrate,
   wherein a plurality of wires and a driver are formed on the second substrate to provide a signal for driving the first electrodes, and a timing controller and a memory are formed on the second substrate to input predetermined data to the driving circuit.

9. The panel according to claim 8, wherein the first electrode uses a transparent electrode, such as an ITO (indium tin oxide), as an anode, and the second electrode uses a metal with a low work function as a cathode.

10. The panel according to claim 8, wherein the driver applies a predetermined signal to at least one of the gate lines and the data lines.

11. The panel according to claim 8, further comprising a connection portion for electrically connecting the first and second substrates with each other, wherein the signal of the driver for driving the organic electro luminescence layer is transmitted to the first substrate through the connection portion.

12. The panel according to claim 11, wherein the driver is a data driver.

13. The panel according to claim 8, further comprising a connection portion for electrically connecting the first and second substrates with each other, wherein the signal of a power source for driving the organic electro luminescence layer is transmitted to the first substrate through the connection portion.

14. The panel according to claim 8, wherein the plurality of wires includes a driver control-signal wire to provide the driver with a control signal, and an OLED (organic light emitting diode) power-source wire to supply the power source to the organic electro luminescence layer.

15. The panel according to claim 8, wherein a FPC (flexible printed circuit) and a FPC connection pad are provided at one side of the second substrate, the connection pad being disposed between the second substrate and the FPC, and wherein the FPC and the connection pad electrically connect the panel with an external system.

16. The panel according to claim 8, wherein the driver is a data driver.

17. An active matrix organic electro luminescence device panel, comprising:
   a first substrate having a plurality of thin film transistors and a plurality of first electrodes, which are respectively within pixels arrayed in matrix, wherein each pixels has an organic electro luminescence layer and a second electrode sequentially formed on one of the first electrodes;
   a second substrate being positioned over the second electrode to prevent the organic electro luminescence layer from being degraded due to oxygen and moisture;
   a sealant that adheres the first and second substrates to each other; and
   a connection portion that electrically connects the first and second substrates with each other,
   wherein the signal of a driver or a power source for driving the organic electro luminescence layer is transmitted to the first substrate through the connection portion.

18. The panel according to claim 17, wherein a FPC (flexible printed circuit) and a FPC connection pad are provided at one side of the second substrate, the connection pad being disposed between the second substrate and the FPC, and wherein the FPC and the connection pad electrically connect the panel with an external system.

19. The panel according to claim 17, wherein the driver is positioned on the second substrate.

20. The panel according to claim 17, wherein the power source is positioned on the second substrate.

* * * * *